(12) United States Patent  
Miyamoto

(10) Patent No.: US 9,263,356 B2  
(45) Date of Patent: Feb. 16, 2016

(54) SEMICONDUCTOR DEVICE

(75) Inventor: Noboru Miyamoto, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 14/376,943

(22) PCT Filed: May 28, 2012

(86) PCT No.: PCT/JP2012/063655  
§ 371 (c)(1),  
(2), (4) Date: Aug. 6, 2014

(87) PCT Pub. No.: WO2013/179374  
PCT Pub. Date: Dec. 5, 2013

(65) Prior Publication Data  
US 2015/0076678 A1    Mar. 19, 2015

(51) Int. Cl.  
*H01L 23/04* (2006.01)  
*H01L 25/11* (2006.01)  
*H01L 25/18* (2006.01)  
*H01L 23/473* (2006.01)  
*H01L 23/46* (2006.01)  
*H01L 23/50* (2006.01)  
*H02M 7/00* (2006.01)

(52) U.S. Cl.  
CPC ............... *H01L 23/04* (2013.01); *H01L 23/46* (2013.01); *H01L 23/473* (2013.01); *H01L 23/50* (2013.01); *H01L 25/115* (2013.01); *H01L 25/18* (2013.01); *H01L 2924/0002* (2013.01); *H02M 7/003* (2013.01)

(58) Field of Classification Search  
None  
See application file for complete search history.

(56) References Cited

U.S. PATENT DOCUMENTS

| | | | | |
|---|---|---|---|---|
| 6,028,779 | A | * | 2/2000 | Sakamoto et al. ............ 363/55 |
| 2001/0002051 | A1 | * | 5/2001 | Matsumoto ................ 257/177 |
| 2003/0151128 | A1 | * | 8/2003 | Kawaguchi ................ 257/691 |
| 2010/0084760 | A1 | * | 4/2010 | Onishi ...................... 257/691 |

(Continued)

FOREIGN PATENT DOCUMENTS

| | | |
|---|---|---|
| JP | S48-065455 A | 9/1973 |
| JP | S57-210699 A | 12/1982 |
| JP | H11-191995 A | 7/1999 |

(Continued)

OTHER PUBLICATIONS

International Search Report; PCT/JP2012/063655; Aug. 21, 2012.

(Continued)

*Primary Examiner* — Duy T Nguyen  
*Assistant Examiner* — Bo Bin Jang  
(74) *Attorney, Agent, or Firm* — Studebaker & Brackett PC

(57) ABSTRACT

A partition in lattice form forms a plurality of housing sections. A plurality of circuit blocks including a semiconductor block and a terminal base block are electrically connected one to another in a state of being housed in the housing sections to form a power semiconductor circuit. The semiconductor block is formed by covering an IGBT with an insulating material. A collector of the IGBT is connected to an electrode through a metal plate. The electrode is led out from an inner portion of the insulating material to a side surface of the insulating material. A terminal base block includes a power terminal to which an external power wiring for supplying electric power to the IGBT is electrically connected, and a screw hole into which a screw for fixing the power wiring is inserted.

3 Claims, 4 Drawing Sheets

(56) References Cited

U.S. PATENT DOCUMENTS

| | | |
|---|---|---|
| 2010/0309633 A1 | 12/2010 | Birner et al. |
| 2011/0053319 A1* | 3/2011 | Hohlfeld et al. ............. 438/121 |

FOREIGN PATENT DOCUMENTS

| | | |
|---|---|---|
| JP | H11-238962 A | 8/1999 |
| JP | H11-317495 A | 11/1999 |
| JP | 2005-136278 A | 5/2005 |
| JP | 2005-260018 A | 9/2005 |
| JP | 3119039 U | 2/2006 |
| JP | 2006-303006 A | 11/2006 |
| JP | 2010-541227 A | 12/2010 |
| JP | 2011-223753 A | 11/2011 |

OTHER PUBLICATIONS

An Office Action; "Notice of Reasons for Rejection," issued by the Japanese Patent Office on Mar. 31, 2015, which corresponds to Japanese Patent Application No. 2014-518111 and is related to U.S. Appl. No. 14/376,943; with English language partial translation.

Notification of Transmittal of Translation of the International Preliminary Report on Patentability and Translation of Written Opinion of the International Searching Authority; PCT/JP2012/063655 issued on Dec. 11, 2014.

* cited by examiner

SEMICONDUCTOR DEVICE

TECHNICAL FIELD

The present invention relates to a semiconductor device capable of easily forming a complicated power semiconductor circuit.

BACKGROUND ART

An ordinary drive circuit of power IGBTs is of a bridge structure such as a 2-in-1 structure in which IGBTs and an FWDs are mounted on the upper arm side and the lower arm side. However, drive circuits to which any ordinary half-bridge circuits cannot be applied, e.g., drive circuits for SR motors not using a rare-earth magnet or the like are being put to practical use (see, for example, Patent Literature 1). Also, a technique to form a semiconductor circuit by disposing block members with electrical circuits between sectional members disposed in lattice form has been proposed (see, for example, Patent Literature 2).

CITATION LIST

Patent Literature

Patent Literature 1: Japanese Patent Laid-Open No. 11-191995
Patent Literature 2: Japanese Patent Laid-Open No. 2005-260018

SUMMARY OF INVENTION

Technical Problem

In a case where an unordinary complicated power semiconductor circuit such as the one disclosed in Patent Literature 1 is formed by combining a plurality of semiconductor modules, connections between the semiconductor modules are complicated. The technique disclosed in Patent Literature 2 presupposes incorporating a low-voltage power supply such as a dry battery without considering connection to an external high-voltage power supply and therefore cannot be applied to a power semiconductor circuit.

The present invention has been made to solve the above-described problems, and an object thereof is to provide a semiconductor device which makes it possible to easily form a complicated power semiconductor circuit.

Means for Solving the Problems

A semiconductor device according to the present invention includes: a partition in lattice form forming a plurality of housing sections; and a plurality of circuit blocks electrically connected one to another in a state of being housed in the housing sections to form a power semiconductor circuit, wherein the circuit blocks at least includes a semiconductor block and a terminal base block, the semiconductor block includes a semiconductor element, an insulating material covering the semiconductor element, and an electrode connected to the semiconductor element and led out from the insulating material, and the terminal base block includes a power terminal to which an external power wiring for supplying electric power to the semiconductor element is electrically connected, and a screw hole into which a screw for fixing the power wiring is inserted.

Advantageous Effects of Invention

The present invention makes it possible to easily form a complicated power semiconductor circuit.

DESCRIPTION OF EMBODIMENTS

A semiconductor device according to the embodiments of the present invention will be described with reference to the drawings. The same components will be denoted by the same symbols, and the repeated description thereof may be omitted.

Embodiment 1

Figure 1:
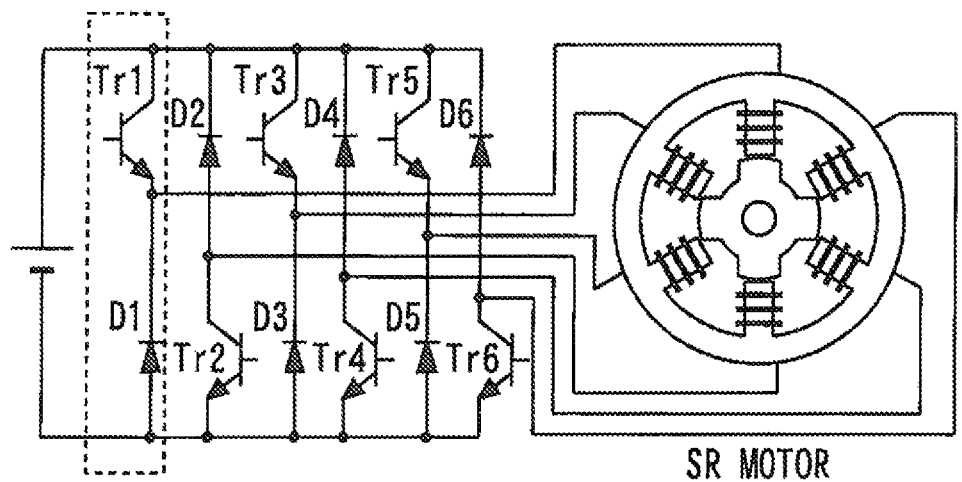
FIG. 1 is a circuit diagram showing a power semiconductor circuit according to an embodiment of the present invention.

FIG. 1 is a circuit diagram showing a power semiconductor circuit according to an embodiment of the present invention. This circuit is a drive circuit for a SR motor. In the drive circuit, transistors Tr1 to Tr6 are connected in series to diodes D1 to D6, respectively. These components are connected to a power supply of a high voltage.

Figure 2:
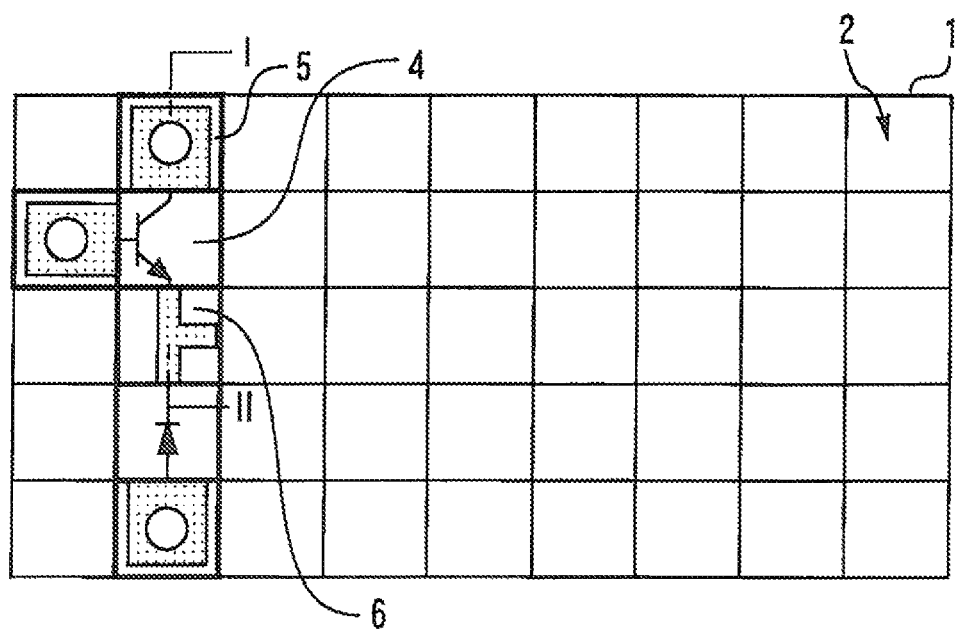
FIG. 2 is a sectional view showing a semiconductor device according to Embodiment 1 of the present invention.
Figure 3:
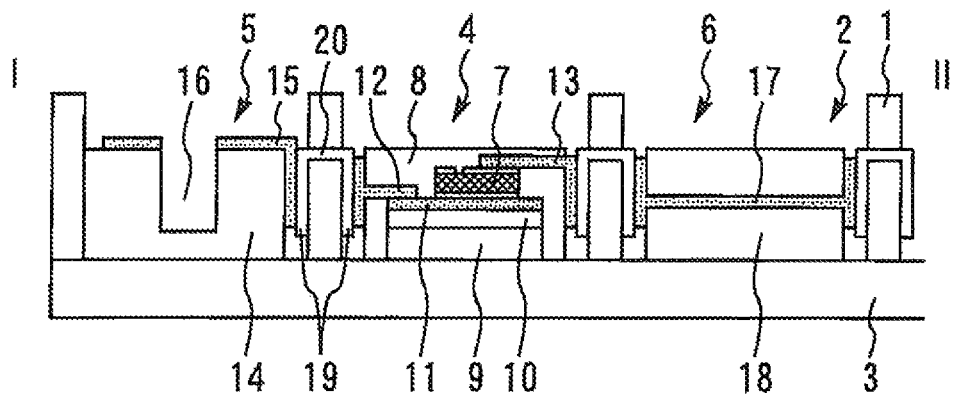
FIG. 3 is a sectional view taken along line I-II in FIG. 2.
Figure 4:
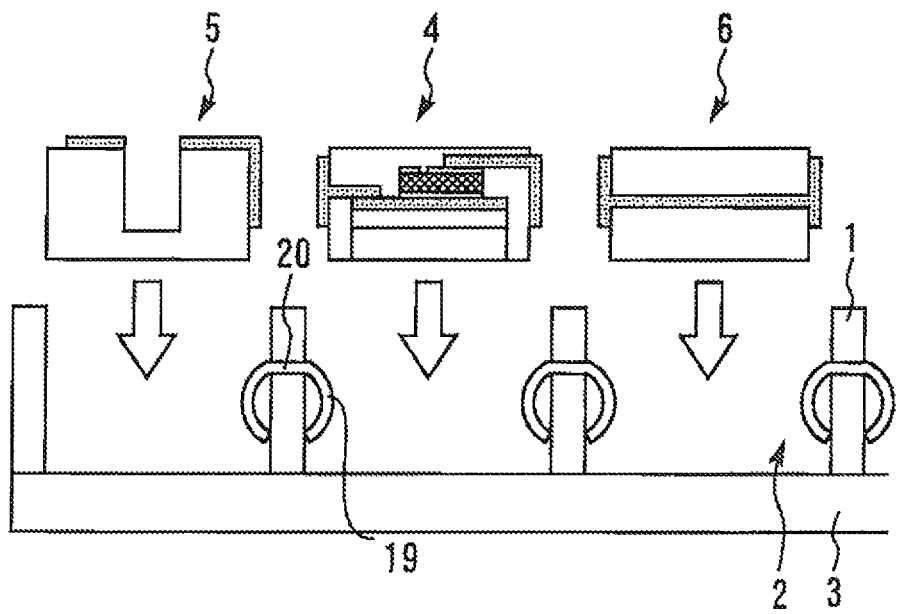
FIG. 4 is a sectional view showing a state of assembly of the device shown in FIG. 3.

FIG. 2 is a sectional view showing a semiconductor device according to Embodiment 1 of the present invention. In this device, the circuit surrounded by the broken line in FIG. 1 is formed. FIG. 3 is a sectional view taken along line I-II in FIG. 2. FIG. 4 is a sectional view showing a state of assembly of the device shown in FIG. 3.

A partition 1 in lattice form forms a plurality of housing sections 2. A cooler 3 is disposed below the partition 1. Circuit blocks including a semiconductor block 4, a terminal base block 5 and a busbar block 6 are electrically connected one to another in a state of being housed in the housing sections 2 to form a power semiconductor circuit. The external shape of the circuit block is a square shape corresponding to the unit lattice size of the housing sections 2.

The semiconductor block 4 is formed by covering an insulated gate bipolar transistor (IGBT) 7 with an insulating material 8. The IGBT 7 is mounted on a cooling member 9, with an insulating sheet 10 and a metal plate 11 interposed therebetween. The collector of the IGBT 7 is connected to an electrode 12 through the metal plate 11, and the emitter of the IGBT 7 is connected to an electrode 13. The electrodes 12 and 13 are led out from inner portions of the body of insulating material 8 to side surfaces of the body of insulating material 8.

The terminal base block 5 includes an insulating block 14 and a power terminal 15 provided on an insulating block 14. External power wiring for supplying electric power to the IGBT 7 is electrically connected to the power terminal 15. A screw hole 16 into which a screw for fixing the power wiring is inserted is provided in the insulating block 14.

The busbar block 6 is formed by covering a busbar 17, i.e., a conductor, with an insulating material 18. Two ends of the busbar 17 are led out to side surfaces of the body of insulating material 18. Other circuit blocks, such as one formed by covering a diode with an insulating material, one formed by covering a capacitor with an insulating material and one formed by covering an inductor with an insulating material, which are not illustrated, are also used.

Wall surface electrodes 19 are provided on wall surfaces of the plurality of housing sections 2, respectively. Between each adjacent pair of housing sections 2, the wall surface electrodes 19 are electrically connected to each other by a through electrode 20 provided through the partition 1. In the state where the semiconductor block 4 is housed in the housing section 2, the electrode 12 in the semiconductor block 4 is brought into contact with and electrically connected to the wall surface electrode 19. In the state where the terminal base block 5 is housed in the housing section 2, the power terminal 15 in the terminal base block 5 is brought into contact with and electrically connected to the wall surface electrode 19. The power terminal 15 in the terminal base block 5 is thereby electrically connected to the collector of the IGBT 7 in the semiconductor block 4.

Even a complicated circuit can easily be formed by combining and housing in the housing section 2 various circuit blocks to connect electrically as described above. An electrical connection to the external high-voltage power supply can be made through the terminal base block 5, thus enabling application to a power semiconductor circuit. In the present embodiment, therefore, a complicated power semiconductor circuit can easily be formed.

Also, a connector is provided on the upper surface of the semiconductor block 4 to make a connection to a control circuit for controlling the IGBT 7 through a communication cable. In this way, a necessary control circuit for a plurality of semiconductor blocks 4 can be connected in a state selected as desired. A connection to the control circuit by means of optical communication may be made by providing a light receiving section in the semiconductor block 4. Insulation and isolation between the low-voltage side and the high-voltage side can easily be achieved in this way.

Embodiment 2

Figure 5:
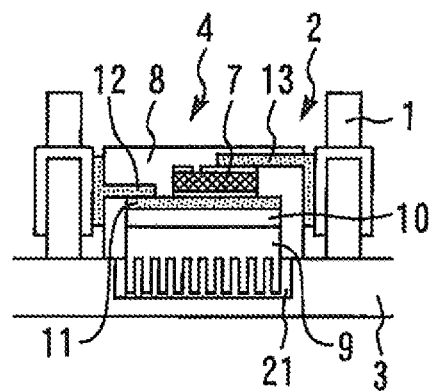
FIG. 5 is a sectional view showing a semiconductor device according to Embodiment 2 of the present invention.

FIG. 5 is a sectional view showing a semiconductor device according to Embodiment 2 of the present invention. The cooler 3 has a cooling medium passage 21 through which a cooling medium such as water passes. The cooling member 9 (fins) thermally connected to the IGBT 7 in the semiconductor block 4 project from a lower surface of the body of insulating material 8. In the state where the semiconductor block 4 is housed in the housing section 2, the cooling member 9 in the semiconductor block 4 is connected to the cooling medium passage 21 to form a cooling system. With this arrangement, the IGBT 7 in the semiconductor block 4 can be cooled with efficiency.

Embodiment 3

Figure 6:
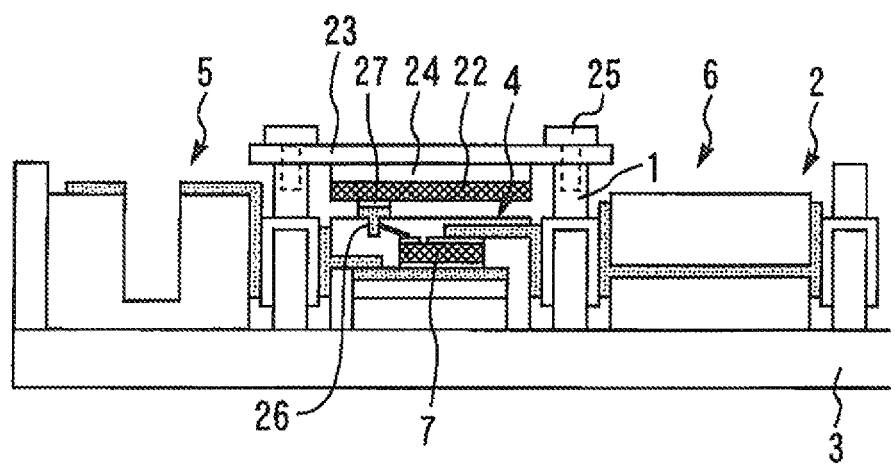
FIG. 6 is a sectional view showing a semiconductor device according to Embodiment 3 of the present invention.

FIG. 6 is a sectional view showing a semiconductor device according to Embodiment 3 of the present invention. The height of the semiconductor block 4 is set lower than the heights of the other circuit blocks and a control substrate 22 for control of the IGBT 7 is disposed on the semiconductor block 4. A pressing plate 23 presses the control substrate 22 against the semiconductor block 4 through a cushioning member 24 such as a spring or rubber. The pressing plate 23 is fixed on the partition 1 with screws 25.

A control electrode 26 electrically connected to the gate of the IGBT 7 is disposed on an upper surface of the body of insulating material 8 in the semiconductor block 4. An output electrode 27 is provided on a back surface of the control substrate 22 so as to face the control electrode 26.

The output electrode 27 on the control substrate 22 pressed by the pressing plate 23 is brought into contact with and electrically connected to the control electrode 26 on the control substrate 22. Also, a thermal connection between the semiconductor block 4 and the cooler 3 can be secured. An electrical connection and a thermal connection can thus be integrally secured. As a result, the assembly facility is improved.

Embodiment 4

Figure 7:
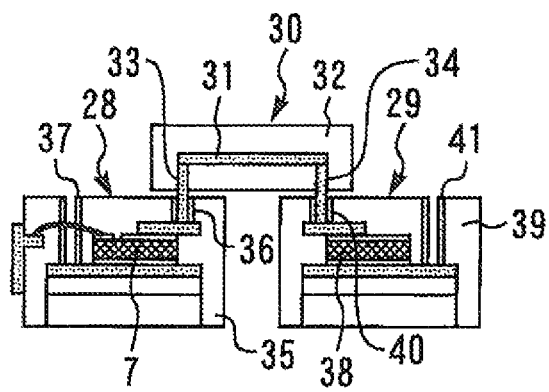
FIG. 7 is a sectional view showing a semiconductor device according Embodiment 4 of the present invention.
Figure 8:
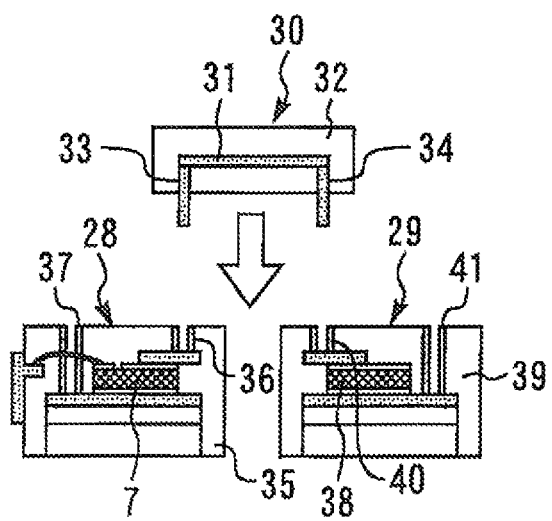
FIG. 8 is a sectional view showing a state where the device shown in FIG. 7 is assembled.

FIG. 7 is a sectional view showing a semiconductor device according Embodiment 4 of the present invention. FIG. 8 is a sectional view showing a state where the device shown in FIG. 7 is assembled. A semiconductor block 28 and a semiconductor block 29 are electrically connected to each other by a busbar block 30 to form a power semiconductor circuit.

The busbar block 30 is formed by covering a busbar 31 with an insulating material 32. Two pins 33 and 34 are respectively connected electrically to two ends of the busbar 31 and project downward from the body of insulating material 32.

The semiconductor block 28 is formed by covering an IGBT 7 with an insulating material 35. Insertion electrodes 36 and 37 having insertion holes in an upper surface of the body of insulating material 35 are electrically connected to the emitter and the collector, respectively, of the IGBT 7.

The semiconductor block 29 is formed by covering a diode 38 with an insulating material 39. Insertion electrodes 40 and 41 having insertion holes in an upper surface of the body of insulating material 39 are electrically connected to the cathode and the anode, respectively, of the diode 38.

The pin 33 of the busbar block 30 is inserted in and electrically connected to the insertion electrode 36 in the semiconductor block 28. The pin 34 is inserted in and electrically connected to the insertion electrode 40 in the semiconductor block 29. The emitter of the IGBT 7 in the semiconductor block 28 and the cathode of the diode 38 in the semiconductor block 29 are thereby connected electrically to each other.

As described above, various semiconductor blocks are combined and electrically connected one to another by busbar blocks 30, thus enabling a complicated power semiconductor circuit to be easily formed even though no such housing sections as those in Embodiment 1 are provided. Also, the connection points can easily be changed by combining busbar blocks 30 having different wiring directions.

DESCRIPTION OF SYMBOLS 1 partition; 2 housing section; 3 cooler; 4 semiconductor block (circuit block); 5 terminal base block (circuit block); 7 IGBT (semiconductor element); 8 insulating material; 9 cooling member; 12 electrode; 15 power terminal; 16 screw hole; 19 wall surface electrode; 21 cooling medium passage; 22 control substrate; 23 pressing plate; 26 control electrode; 27 output electrode; 28,29 semiconductor block; 30 busbar block; 31 busbar; 32 insulating material (first insulating material); 33,34 pin; 35,39 insulating material (second insulating material); 36,37,40,41 insertion electrode; 38 diode (semiconductor element)

The invention claimed is:

1. A semiconductor device comprising:
a partition in lattice form forming a plurality of housing sections; and
a plurality of circuit blocks electrically connected one to another in a state of being housed in the housing sections to form a power semiconductor circuit,
wall surface electrodes disposed on wall surfaces of the housing sections respectively and electrically connected to each other between each adjacent pair of housing sections,
wherein external shapes of the circuit blocks are square shapes corresponding to unit lattice sizes of the housing sections,
the circuit blocks at least includes a semiconductor block and a terminal base block,
the semiconductor block includes a semiconductor element, an insulating material covering the semiconductor element, and an electrode connected to the semiconductor element and led out from the insulating material,
the terminal base block includes a power terminal to which an external power wiring for supplying electric power to the semiconductor element is electrically connected, and a screw hole into which a screw for fixing the power wiring is inserted,
the electrode in the semiconductor block is brought into contact with and electrically connected to the wall surface electrode in a state where the semiconductor block is housed in the housing section, and
the power terminal in the terminal base block is brought into contact with and electrically connected to the wall surface electrode in a state where the terminal base block is housed in the housing section.

2. The semiconductor device according to claim 1, further comprising a cooler disposed below the partition and having a cooling medium passage through which a cooling medium passes,
wherein the semiconductor block further includes a cooling member thermally connected to the semiconductor element and projecting from a lower surface of the insulating material, and
the cooling member in the semiconductor block is connected to the cooling medium passage to form a cooling system in a state where the semiconductor block is housed in the housing section.

3. The semiconductor device according to claim 1, further comprising:
a control substrate disposed on the semiconductor block and controlling the semiconductor element; and
a pressing plate pressing the control substrate against the semiconductor block,
wherein the semiconductor block further includes a control electrode disposed on an upper surface of the insulating material and electrically connected to a control terminal of the semiconductor element, and
an output electrode on the control substrate pressed by the pressing plate is brought into contact with and electrically connected to the control electrode on the control substrate.

* * * * *